(12) United States Patent
Park

(10) Patent No.: US 7,560,861 B2
(45) Date of Patent: Jul. 14, 2009

(54) ORGANIC ELECTRO-LUMINESCENCE DISPLAY DEVICE WITH AN ORGANIC ELECTRO-LUMINESCENCE ARRAY AND FABRICATING METHOD THEREOF

(75) Inventor: Chong Hyun Park, Daegu (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/118,543

(22) Filed: May 2, 2005

(65) Prior Publication Data
US 2005/0242719 A1 Nov. 3, 2005

(30) Foreign Application Priority Data

May 3, 2004 (KR) ...................... 10-2004-0031000
May 3, 2004 (KR) ...................... 10-2004-0031001

(51) Int. Cl.
*H01J 1/62* (2006.01)
(52) U.S. Cl. ....................................... 313/504; 313/512
(58) Field of Classification Search ......... 313/504–512, 313/582–587; 428/917; 315/169.3; 345/36
See application file for complete search history.

(56) References Cited

U.S. PATENT DOCUMENTS

| 6,582,504 | B1 | 6/2003 | Fujita | |
|---|---|---|---|---|
| 6,781,309 | B2 * | 8/2004 | Choi et al. | 313/586 |
| 7,154,222 | B2 * | 12/2006 | Woo et al. | 313/582 |
| 2002/0187575 | A1 | 12/2002 | Maruyama et al. | |
| 2003/0042852 | A1 | 3/2003 | Chen | |
| 2003/0080678 | A1 | 5/2003 | Kim et al. | |
| 2004/0051449 | A1 | 3/2004 | Klausmann et al. | |
| 2004/0124770 | A1 * | 7/2004 | Hayashi et al. | 313/506 |

FOREIGN PATENT DOCUMENTS

| CN | 1414819 A | 4/2003 |
|---|---|---|
| CN | 1452437 A | 10/2003 |
| JP | 2000-030858 A | 1/2000 |
| JP | 2000-243558 A | 9/2000 |

\* cited by examiner

*Primary Examiner*—Joseph L Williams
(74) *Attorney, Agent, or Firm*—Birch, Stewart, Kolasch & Birch, LLP

(57) ABSTRACT

An organic electro-luminescence display device and a fabricating method thereof for preventing deterioration of light-emission efficiency and picture quality are provided. In the organic electro-luminescence display device, an organic electro-luminescence array has first and second electrodes provided on a substrate with an organic light-emitting layer therebetween and a barrier rib parallel to one of the first and second electrodes. A dummy barrier rib is connected to each of the barrier ribs and provided in such a manner to surround the organic electro-luminescence array along with the barrier rib.

10 Claims, 20 Drawing Sheets

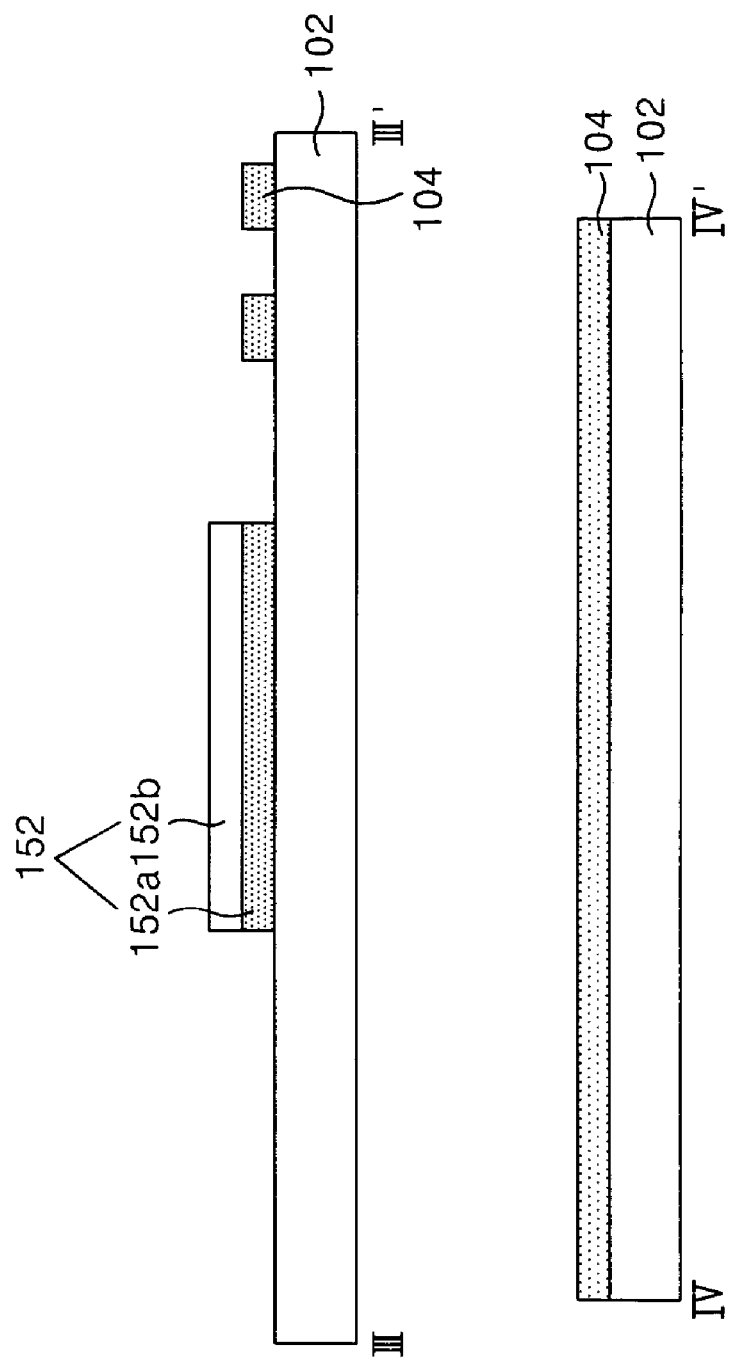

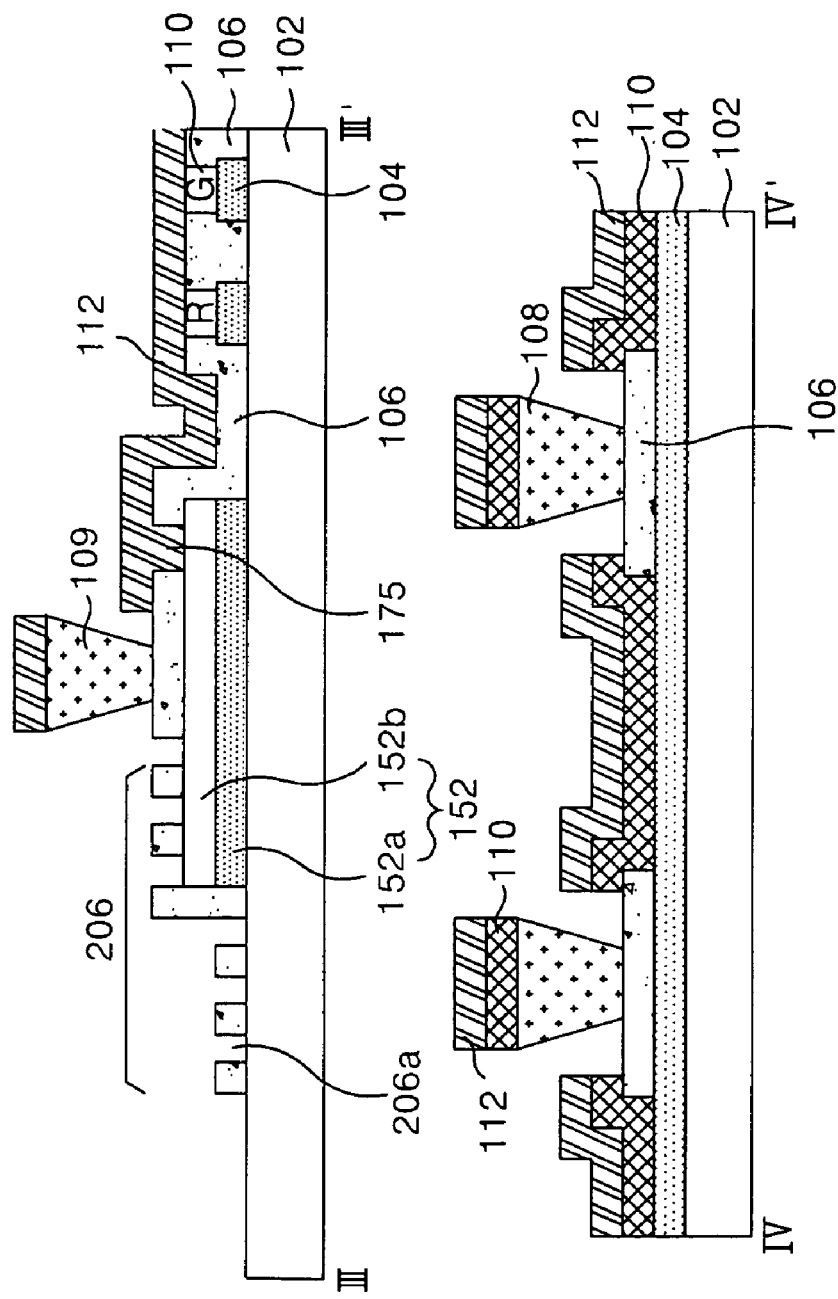

ORGANIC ELECTRO-LUMINESCENCE DISPLAY DEVICE WITH AN ORGANIC ELECTRO-LUMINESCENCE ARRAY AND FABRICATING METHOD THEREOF

This application claims the benefit of the Korean Patent Application Nos. P2004-31000 and P2004-31001 filed on May 3, 2004 and on May 3, 2004, which are hereby incorporated by reference.

BACKGROUND OF THE INVENTION

1. Field of the Invention

This invention relates to an electro-luminescence display (ELD), and more particularly to an organic electro-luminescence display device and a fabricating method thereof that are adaptive for preventing a deterioration of light-emission efficiency and picture quality.

2. Description of the Related Art

Recently, there have been developed various flat panel display devices reduced in weight and bulk that is capable of eliminating disadvantages of a cathode ray tube (CRT). Such flat panel display devices include a liquid crystal display (LCD), a field emission display (FED), a plasma display panel (PDP) and an electro-luminescence (EL) display, etc.

There have been actively processed studies for attempting to make a high display quality and a large-dimension screen of the flat panel display device. In such flat panel display devices, the EL display device is a self-luminous device capable of light-emitting for himself. The EL display device excites a phosphorous material using carriers such as electrons and holes, thereby displaying a video image.

The EL display device is largely classified into an inorganic EL display device and an organic EL display device depending upon the used material.

Since the organic EL display device is driven with a lower voltage (i.e., about 5 to 20V) than the inorganic EL display device requiring a high voltage of 100 to 200V, it permits a direct current low voltage driving. Also, since the organic EL display device has excellent characteristics such as a wide viewing angle, a fast response and a high contrast ratio, etc., it can be used for a pixel of a graphic display, or a pixel of a television image display or a surface light source. Further, the organic EL display device is a device suitable for a post generation flat panel display because it has a thin thickness, a light weight and an excellent color sense.

FIG. 1 is a schematic view showing a structure of a general organic EL display device, and FIG. 2 is a detailed plan view of a portion (A area) in FIG. 1. FIG. 3 is a section view of the portion of the organic El display device taken along the I-I' and II-II' lines in FIG. 2.

Referring to FIG. 1 to FIG. 3, the related art EL display device includes a display area P1 provided with an organic EL array having driving electrodes (e.g., an anode electrode and a cathode electrode), etc., and a non-display area P2 provided with a pad portion 25 for applying driving signals to the driving electrodes at the display area P1. The display area P1 is provided with an anode electrode 4 formed on a substrate 2, and a cathode electrode 12 formed in a direction crossing the anode electrode 4.

A plurality of anode electrodes 4 are provided on the substrate 2 in such a manner to be spaced at a desired distance from each other. An insulting film 6 having an aperture for each EL cell area is formed on the substrate 2 provided with the anode electrode 4. On the insulating film 6, a barrier rib 8 for making a separation of an organic light-emitting layer 10 and a cathode electrode 12 to be formed thereon is provided.

The barrier rib 8 is formed in a direction crossing the anode electrode 4, and has an overhang structure in which the upper portion thereof has a larger width than the lower portion thereof. The organic light-emitting layer 10 made from an organic compound and the cathode electrode 12 are entirely deposited onto the insulating film 6 provided with the barrier rib 8. The organic light-emitting layer 10 is formed by depositing a hole carrier layer, a light-emitting layer and an electron carrier layer onto the insulating film 6.

The non-display area P2 is provided with a first line 54 extended from the anode electrode 4 at the display area P1, data pads for supplying data voltages, via the first line 52, to the anode electrode 4, a second line 52 connected to the cathode electrode 12, and scan pads for supplying scan voltages via the second line 52. Herein, the second line 52 consists of a double layer having a transparent conductive layer 52a and an opaque conductive layer 52b. The data pad is connected to a tape carrier package (TCP) mounted with a first driving circuit for generating data voltages to thereby supply the data voltage to each anode voltage 4. The scan pad is provided at each side of the data pad. The scan pad is connected to a TCP mounted with a second driving circuit for generating scan voltages to thereby supply the scan voltage to each cathode electrode 12.

The organic EL array at the display area P1 has a characteristic liable to be deteriorated against moisture and oxygen. In order to overcome this problem, an encapsulating process is carried out to join the substrate 2 provided with the organic EL array of the anode electrode 2, etc. with a cap 28 by a sealant 25 such as an epoxy resin. A getter for absorbing the moisture and oxygen is filled into the rear center portion of the cap 28 to thereby protect an organic EL array from the oxygen and moisture.

In the related art organic EL display device having the structure as mentioned above, as shown in FIG. 4, if a voltage is applied between the anode electrode 4 and the cathode electrode 12, then electrons (or cathodes) generated from the cathode electrode 12 are moved, via an electron injection layer 10a and an electron carrier layer 10b, into a light-emitting layer 10c. On the other hand, holes (or anodes) generated from the anode electrode 4 are moved, via a hole injection layer 10d and a hole carrier layer 10e, into the light-emitting layer 10c. Thus, electrons and holes fed from the electron carrier layer 10b and the hole carrier layer 10e are collided with each other to be re-combined at the light-emitting layer 10c, thereby generating a light. This light is emitted into the exterior via the anode electrode 4, thereby displaying a picture.

Meanwhile, in such an organic EL display device, the sealant 25 may be frequently flown, via between the barrier rib 8 and the barrier rib 8, into the organic EL array of the display area P1 when the cap 28 is joined with the cap 2. The sealant 25 contains a large amount of moisture, oxygen and impurity to cause a damage to the organic light-emitting layer 10 of the organic EL array. Therefore, there is raised a problem in that a light-emission efficiency and a picture quality are deteriorated.

SUMMARY OF THE INVENTION

Accordingly, it is an object of the present invention to provide an organic electro-luminescence display device and a fabricating method thereof that are adaptive for preventing a deterioration of light-emission efficiency and picture quality.

In order to achieve these and other objects of the invention, an organic electro-luminescence display device according to one aspect of the present invention includes an organic electro-luminescence array having first and second electrodes provided on a substrate with having an organic light-emitting layer therebetween and a barrier rib parallel to any one of the first and second electrodes; and a dummy barrier rib connected to each of the barrier ribs and provided in such a manner to enclose the organic electro-luminescence array along with the barrier rib.

The organic electro-luminescence display device further includes a cap joined with the substrate by a sealant to package the organic electro-luminescence array.

In the organic electro-luminescence display device, the sealant is positioned at the outer areas of the barrier rib and the dummy barrier rib.

The organic electro-luminescence display device further includes a signal supply pad for supplying a driving signal to the organic electro-luminescence array; and a signal line for electrically connecting any one of the first and second electrodes to the signal supply pad.

The organic electro-luminescence display device further includes an insulating film for exposing a light-emitting area at the first electrode and for exposing the signal line, wherein any one of the first and second electrodes is connected, via said contact hole, to the signal line.

An organic electro-luminescence display device, in which a substrate provided with an organic electro-luminescence array is joined with a cap by a sealant in order to package the organic electro-luminescence array, according to another aspect of the present invention includes a first insulating pattern positioned between the organic electro-luminescence array and the sealant and provided in such a manner to have concave and convex portions.

In the organic electro-luminescence display device, the organic electro-luminescence array includes first and second electrodes provided on a substrate with having an organic light-emitting layer therebetween; and a barrier rib being parallel to any one of the first and second electrodes.

The organic electro-luminescence display device further includes a signal supply pad for supplying a driving signal to the organic electro-luminescence array; and a signal line for electrically connecting any one of the first and second electrodes to the signal supply pad.

The organic electro-luminescence display device further includes a second insulating pattern having a contact hole for exposing a light-emitting area at the first electrode and for exposing the signal line, wherein any one of the first and second electrodes is connected, via said contact hole, to the signal line.

A method of fabricating an organic electro-luminescence display device, in which a substrate provided with an organic electro-luminescence array is joined with a cap by a sealant in order to package the organic electro-luminescence array, according to still another aspect of the present invention includes the step of forming a first insulating pattern positioned between the organic electro-luminescence array and the sealant and provided in such a manner to have concave and convex portions.

BRIEF DESCRIPTION OF THE DRAWINGS

These and other objects of the invention will be apparent from the following detailed description of the embodiments of the present invention with reference to the accompanying drawings, in which:

FIG. 10A to FIG. 10F are section views for sequentially explaining a method of fabricating the organic electro-luminescence display device shown in FIG. 8.

DETAILED DESCRIPTION OF THE PREFERRED EMBODIMENT

Reference will now be made in detail to the preferred embodiments of the present invention, examples of which are illustrated in the accompanying drawings.

Hereinafter, the preferred embodiment of the present invention will be described in detail with reference to FIGS. 5 to 10F.

Figure 5:
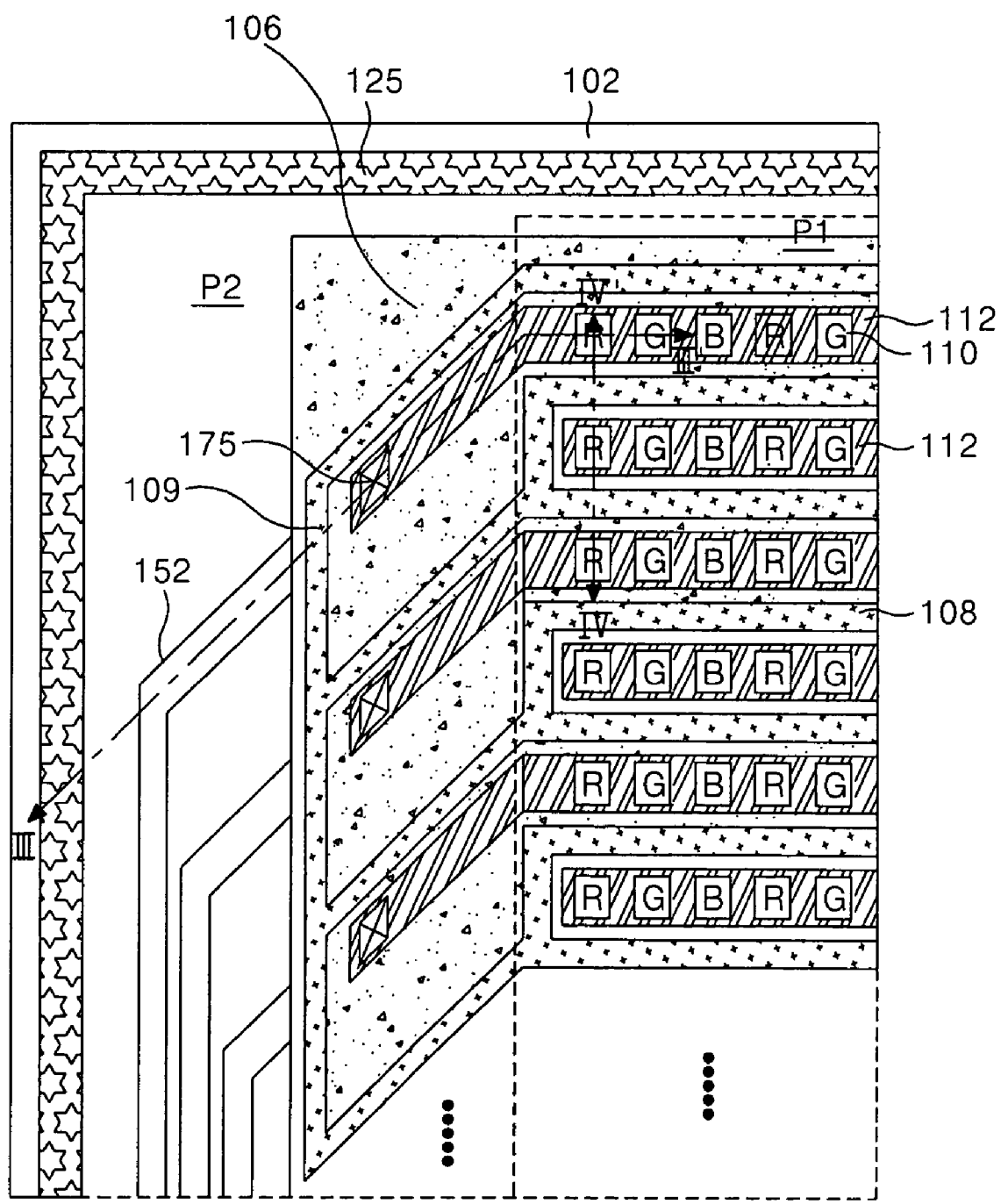
FIG. 5 illustrates a portion of an organic electro-luminescence display device according to a first embodiment of the present invention.
Figure 6:
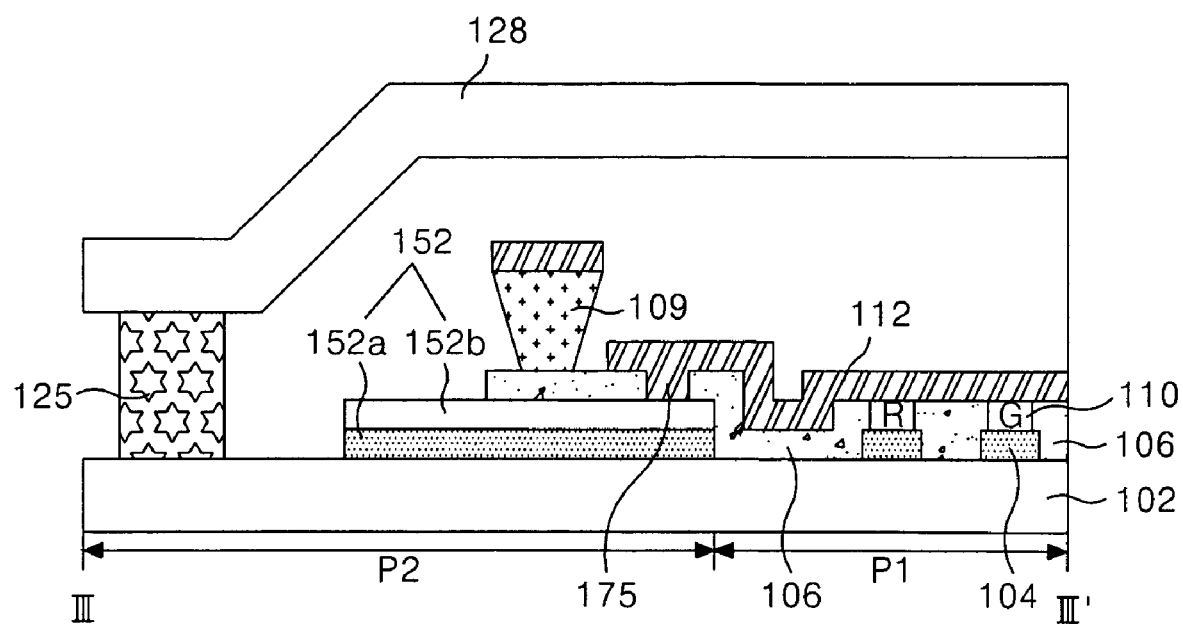
FIG. 6 is a section view of the organic electro-luminescence display device taken along the III-III' and IV-IV' lines in FIG. 5.
Figure 6:
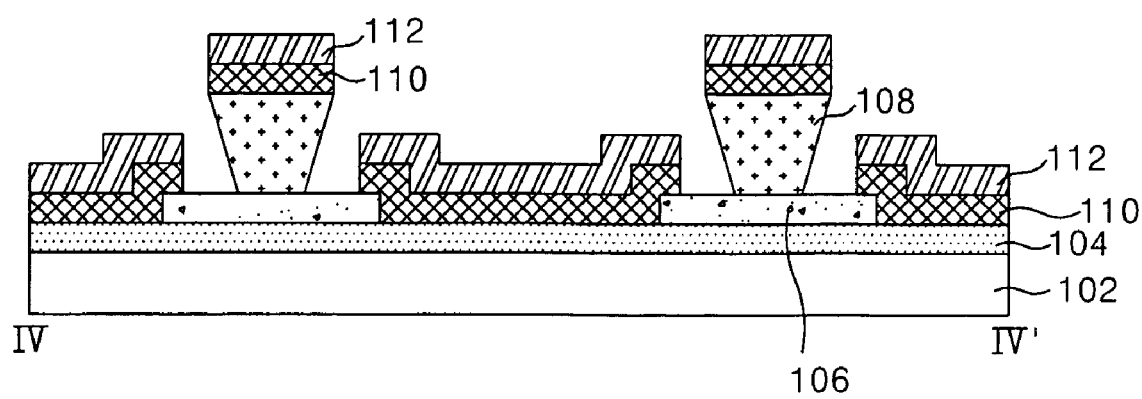

FIG. 5 shows a portion of an organic electro-luminescence display device according to a first embodiment of the present invention, and FIG. 6 is a section view of the organic electro-luminescence display device taken along the III-III' and IV-IV' lines in FIG. 5.

Referring to FIG. 5 and FIG. 6, the EL display device includes a display area P1 provided with an organic EL array having an anode electrode, etc., and a non-display area P2 provided with a pad portion for applying driving signals to the driving electrodes at the display area P1.

The display area P1 is provided with an anode electrode 104 formed on a substrate 102, and a cathode electrode 112 formed in a direction crossing the anode electrode 104.

A plurality of anode electrodes 104 are provided on the substrate 102 in such a manner to be spaced at a desired distance from each other. An insulting film 106 having an aperture for defining a light-emitting area for each EL cell area and a contact hole 175 for exposing a second line 152 is formed on the substrate 102 provided with the anode electrode 104. A barrier rib 108 having an overhang structure in which the upper portion thereof has a larger width than the lower portion thereof is provided on the insulating film 106.

The barrier rib 108 plays a role to disconnect an organic light-emitting layer 110 to be formed thereon from a cathode line 112.

The organic light-emitting layer 110 made from an organic compound and the cathode electrode 112 are entirely deposited sequentially on the insulating film 106 provided with the barrier rib 108. The organic light-emitting layer 110 is formed by disposing a hole carrier layer, a light-emitting layer and an electron carrier layer onto the insulating film 6.

The non-display area P2 is provided with a first line (not shown) extended from the anode electrode 104 at the display area P1, data pads for supplying data voltages, via the first line, to the anode electrode 104, a second line 152 connected to the cathode electrode 112, and scan pads for supplying scan voltages via the second line 152. Herein, the cathode electrode 112 is connected, via the contact hole 175 passing through the insulating film 106, to the second line 52. The second line 152 consists of a double layer having a transparent conductive layer 152a and an opaque conductive layer 152b.

The data pad is connected to a tape carrier package (TCP) mounted with a first driving circuit for generating data voltages to thereby supply the data voltage to each anode voltage 104. The scan pad is provided at each side of the data pad. The scan pad is connected to a TCP mounted with a second driving circuit for generating scan voltages to thereby supply the scan voltage to each cathode electrode 112.

Further, the non-display area P2 is provided with a dummy barrier rib 109 connected to each of the barrier ribs positioned at the display area P1. The dummy barrier rib 109 plays a role to protect the organic EL array from being damaged by the sealant 125 when the substrate 102 is attached to the cap 128 because the sealant 125 may flow along with the barrier rib 108 into the display area P1. In other words, the dummy barrier rib 109 is provided between the organic EL array and the sealant 125, thereby preventing the sealant 125 from being flown into the organic EL array.

This prevents a damage of the organic light-emitting layer of the organic EL array caused by the sealant 125 during the encapsulation process, thereby preventing a deterioration of light-emission efficiency and picture quality.

FIG. 7A to FIG. 7F are views for sequentially explaining a method of fabricating the organic EL display device according to the first embodiment of the present invention.

Figure 7A:
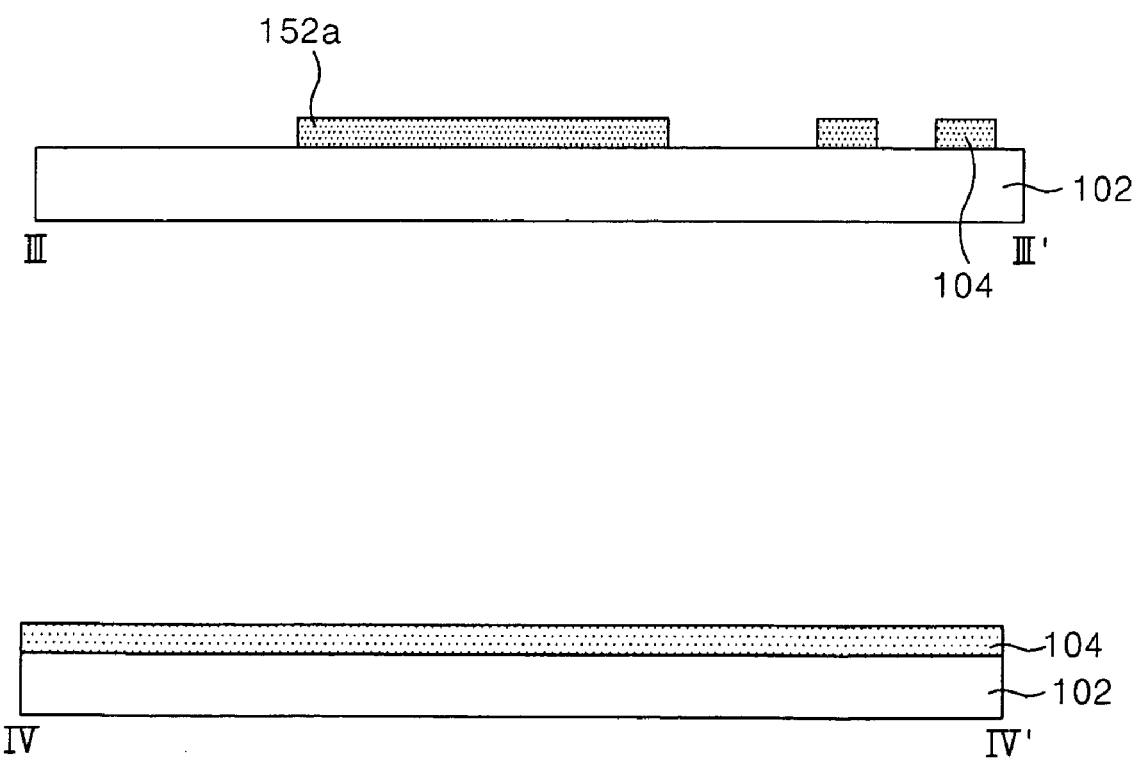
FIG. 7A to FIG. 7F are section views for sequentially explaining a method of fabricating the organic electro-luminescence display device shown in FIG. 6.

Firstly, as shown in FIG. 7A, the anode electrode 104 and the transparent conductive layer 152a are provided by depositing a metal transparent conductive material onto the substrate 102 made from a sodalime or a vulcanized glass and then patterning it by the photolithography and the etching process. Herein, indium-tin-oxide (ITO) or $SnO_2$ is used as the metal material.

Figure 7B:
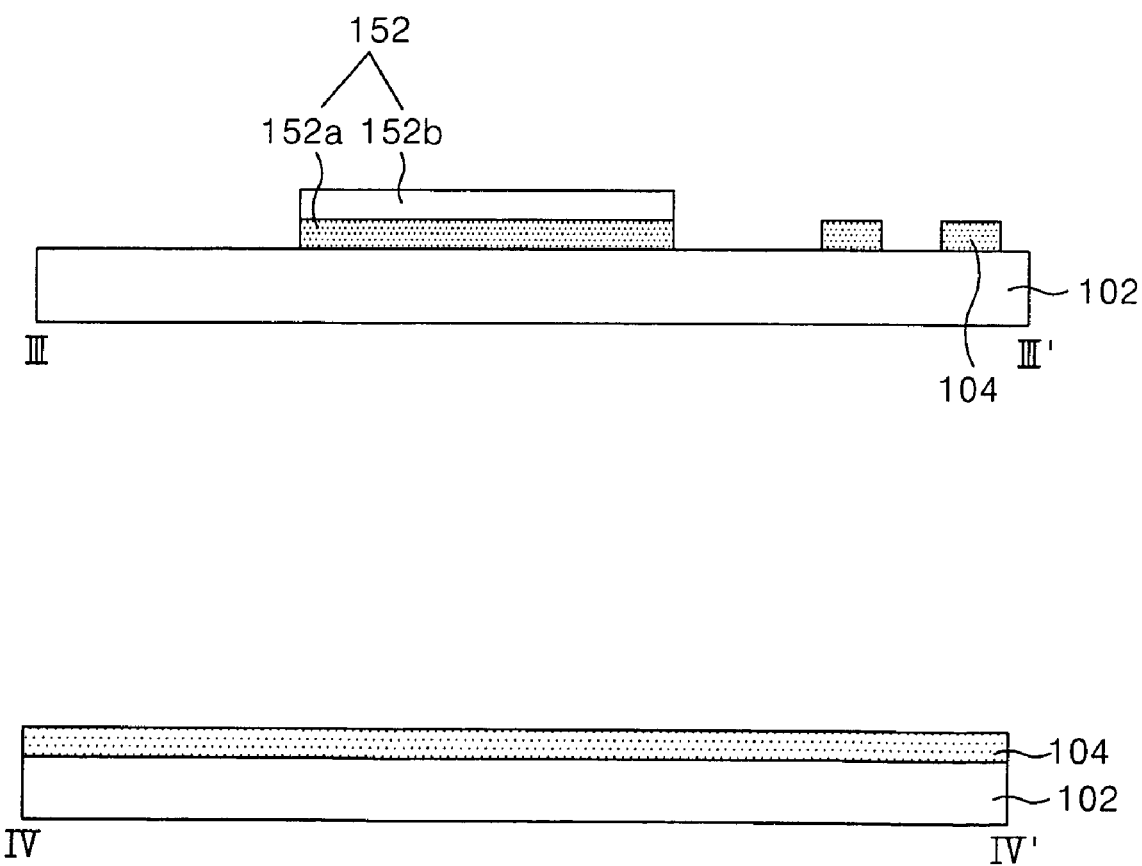

As shown in FIG. 7B, the opaque conductive layer 152b is provided by forming an opaque conductive material on the substrate 102 provided with the anode electrode 104 and the transparent conductive layer 152a and patterning it by the photolithography and the etching process. Thus, there is provided the second line 152 that is a double layer of the transparent conductive layer 152a and the opaque conductive layer 152b.

Figure 7C:
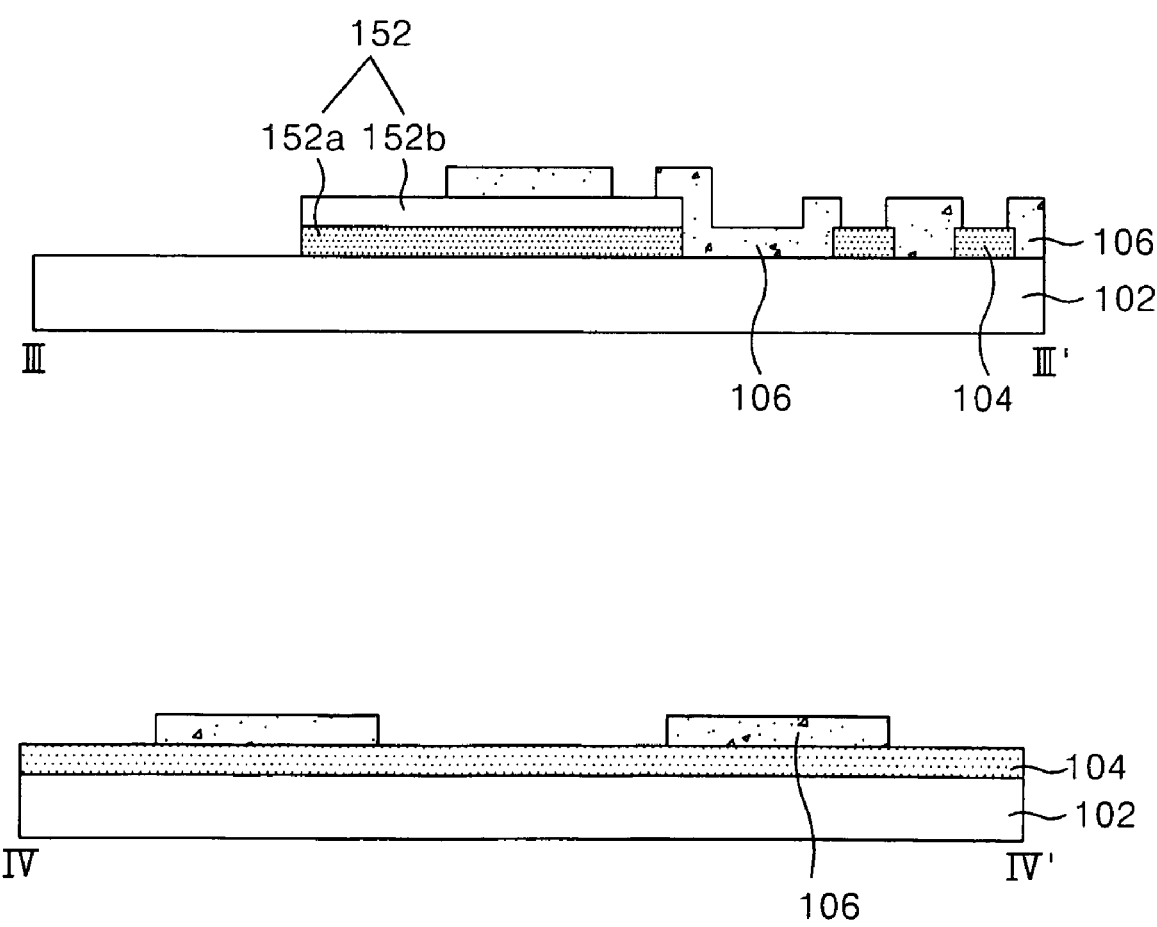

As shown in FIG. 7C, the insulating film 106 having the contact hole 175 exposing the light-emitting area of the display area P1 and exposing the second line 152 of the non-display area P2 is provided by coating a photosensitive insulating material onto the substrate 102 provided with the second line 152 by the spin coating technique and then patterning it by the photolithography and the etching process.

Figure 7D:
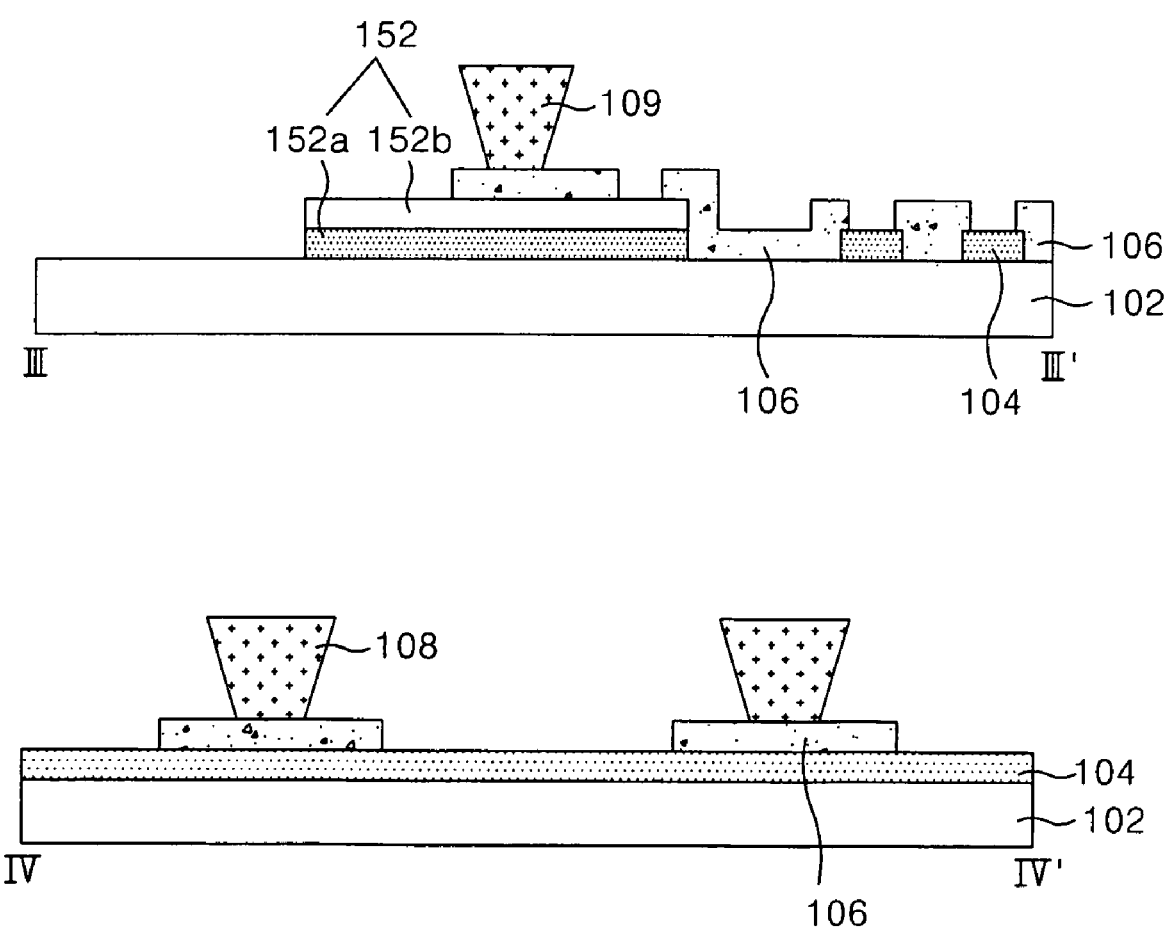

As shown in FIG. 7D, the barrier rib 108 and the dummy barrier rib 109 are provided by depositing a photosensitive organic material onto the insulating film 106 by the photolithography and the etching process. The barrier rib 108 is provided at a non-emitting area in such a manner to cross a plurality of anode electrodes 104 in order to divide the pixels, and the dummy barrier rib 109 is connected to each of the barrier rib 108 at the display area P1 and is positioned at the non-display area P1. Herein, the barrier rib 108 and the dummy barrier rib 109 are provided in such a manner to connect each other, thereby enclosing the organic EL array.

Figure 7E:
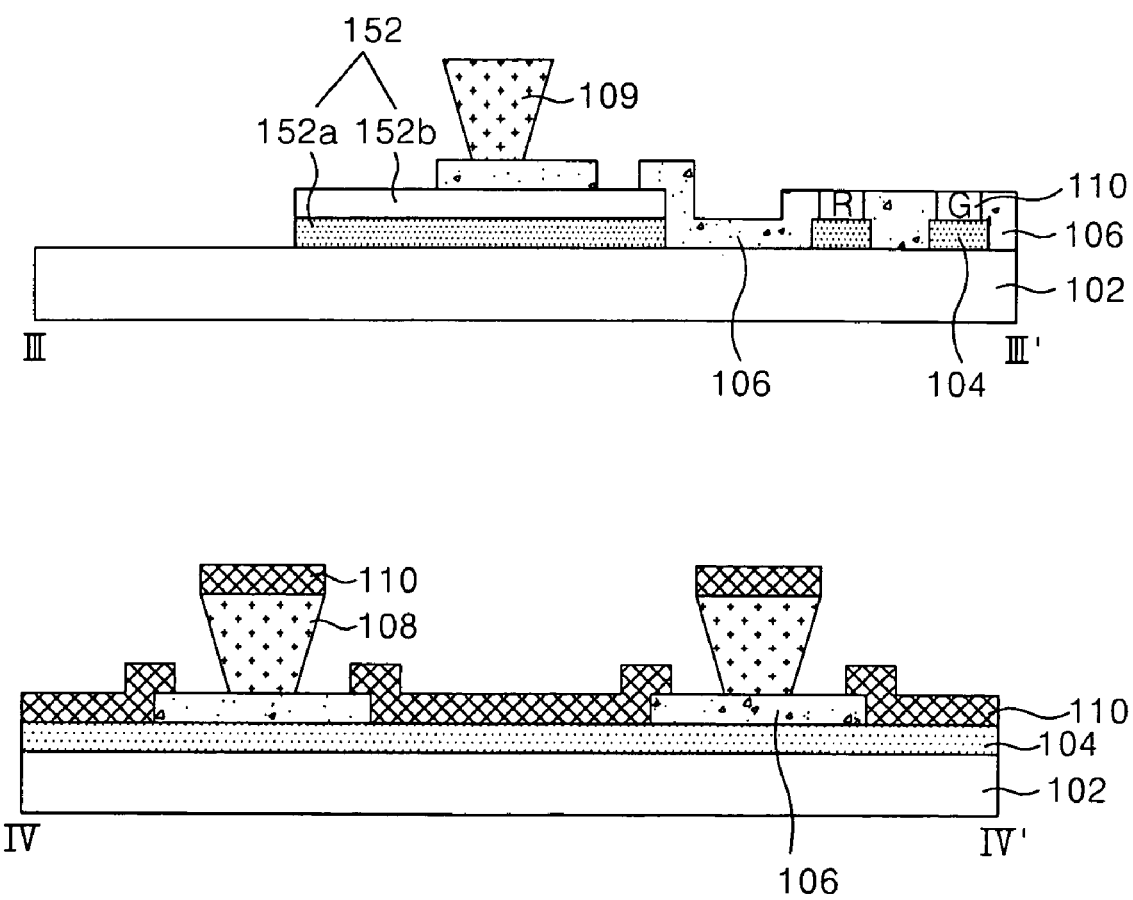

As shown in FIG. 7E, the organic light-emitting layer 110 is formed on the substrate 102 provided with the barrier rib 108.

Figure 7F:
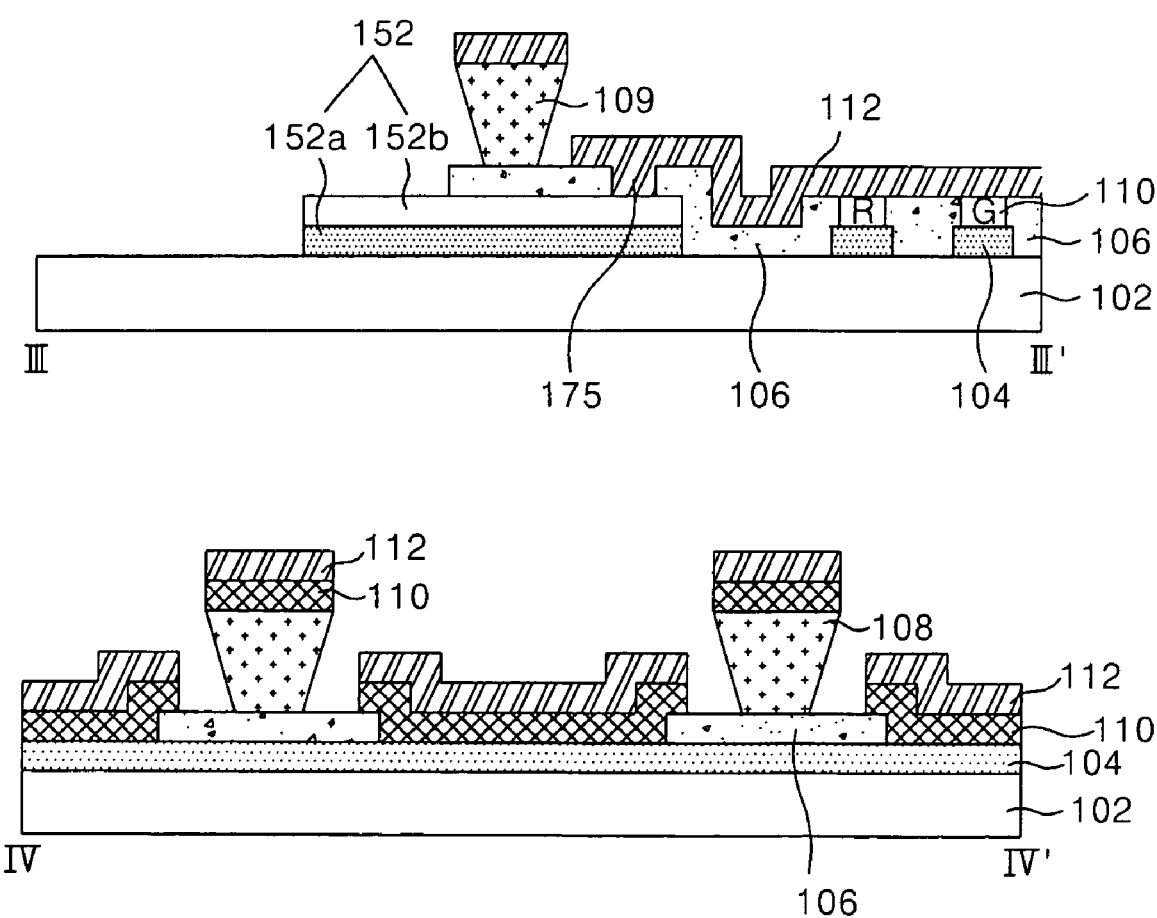

As shown in FIG. 7F, the cathode electrode 112 formed in parallel to the barrier rib 108 and connected to the second line 152 exposed through the contact hole 175 is provided by depositing a metal material onto the substrate 102 provided with the organic light-emitting layer 110.

As described above, the organic EL display device according to the first embodiment of the present invention includes the dummy barrier rib 109 connected to each of the barrier ribs 108 at the display area P1 and located between the sealant 125 and the organic EL array. Thus, the organic EL array provided at the display area P1 is enclosed by the barrier rib 108 and the dummy barrier rib 109, so that it becomes possible to prevent the sealant 125 from being flown into the organic EL array. As a result, a damage of the organic light-emitting layer 110 can be prevented and hence a deterioration of light-emission efficiency and picture quality can be prevented.

Figure 8:
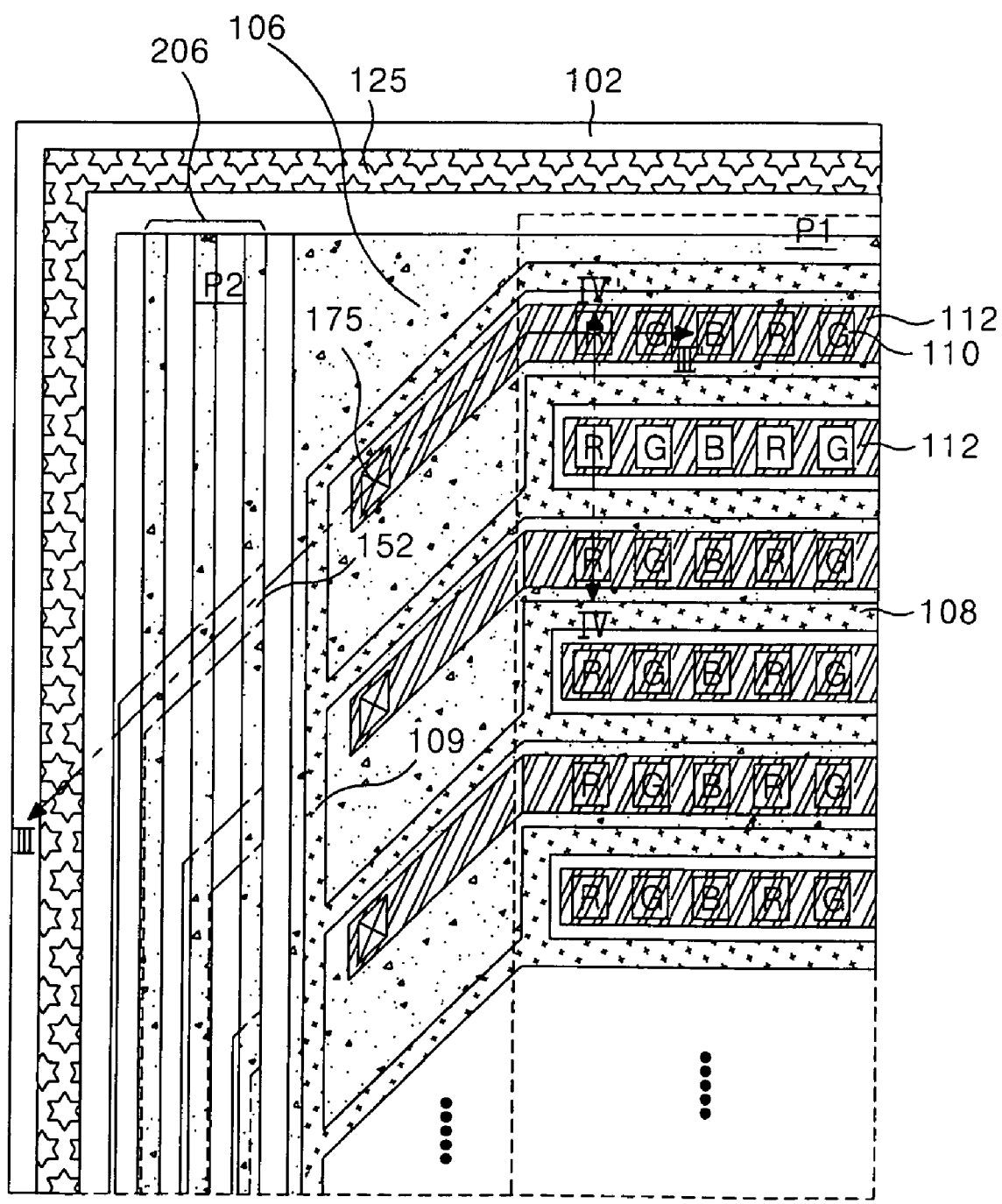
FIG. 8 illustrates a portion of an organic electro-luminescence display device according to a second embodiment of the present invention.
Figure 9:
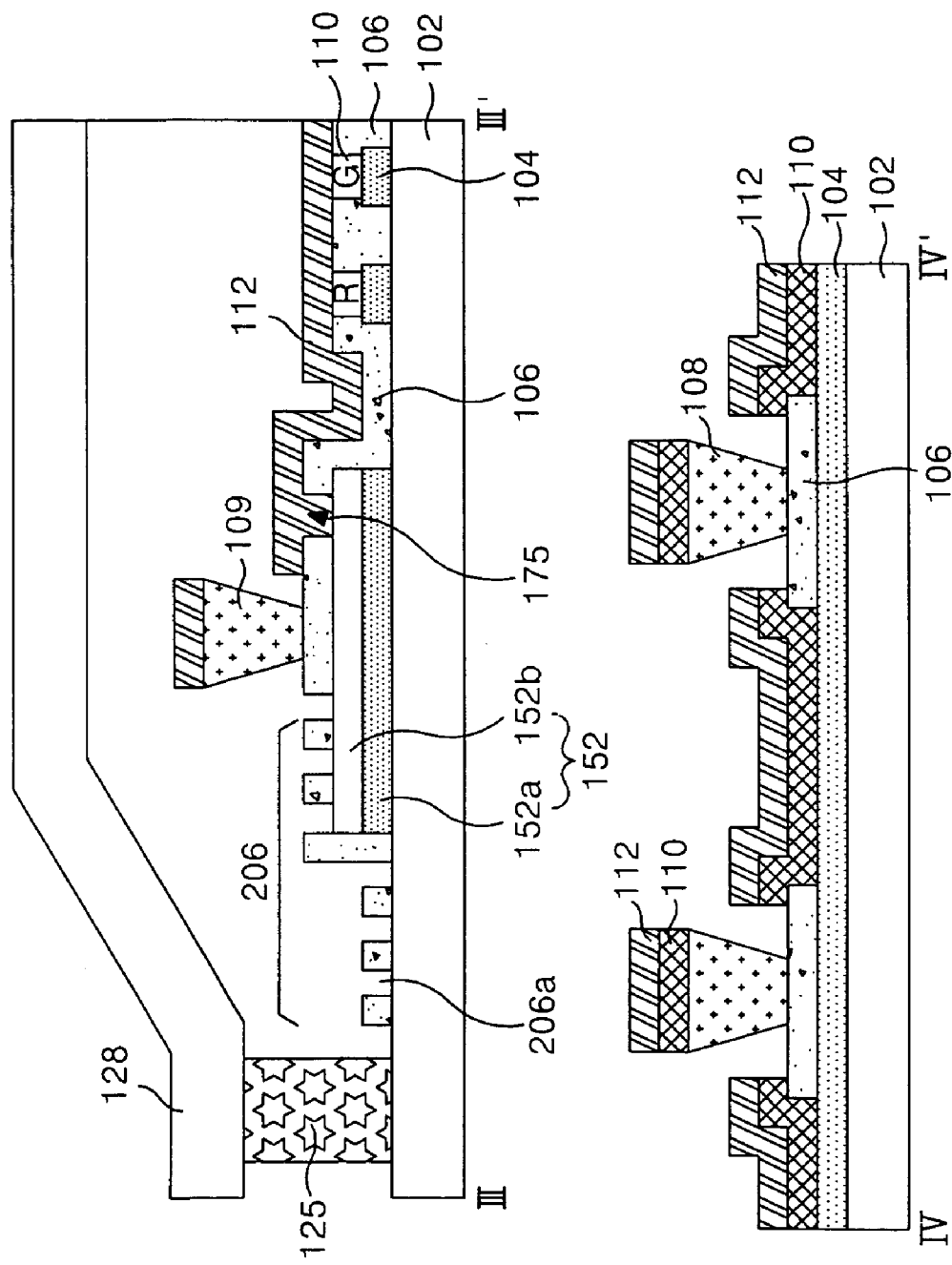
FIG. 9 is a section view of the organic electro-luminescence display device taken along the III-III and IV-IV' lines in FIG. 8.

FIG. 8 illustrates a portion of an organic electro-luminescence display device according to a second embodiment of the present invention, and FIG. 9 is a section view of the organic electro-luminescence display device taken along the III-III' and IV-IV' lines in FIG. 8.

Referring to FIG. 8 and FIG. 9, the EL display device includes a display area P1 provided with an organic EL array having an anode electrode, etc., and a non-display area P2 provided with a pad portion for applying driving signals to the driving electrodes at the display area P1.

The display area P1 is provided with an anode electrode 104 formed on a substrate 102, and a cathode electrode 112 formed in a direction crossing the anode electrode 104.

A plurality of anode electrodes 104 are provided on the substrate 102 in such a manner to be spaced at a desired distance from each other. An insulting film 106 having an aperture for defining a light-emitting area for each EL cell area and a contact hole 175 for exposing a second line 152 is formed on the substrate 102 provided with the anode electrode 104. A barrier rib 108 having an overhang structure in which the upper portion thereof has a larger width than the lower portion thereof is provided on the insulating film 106.

The barrier rib 108 plays a role to disconnect an organic light-emitting layer 110 to be formed thereon from a cathode line 112.

The organic light-emitting layer 110 made from an organic compound and the cathode electrode 112 are entirely deposited sequentially on the insulating film 106 provided with the barrier rib 108. The organic light-emitting layer 110 is formed by disposing a hole carrier layer, a light-emitting layer and an electron carrier layer onto the insulating film 6.

The non-display area P2 is provided with a first line (not shown) extended from the anode electrode 104 at the display area P1, data pads for supplying data voltages, via the first line, to the anode electrode 104, a second line 152 connected to the cathode electrode 112, and scan pads for supplying scan voltages via the second line 152. Herein, the cathode electrode 112 is connected, via the contact hole 175 passing through the insulating film 106, to the second line 52. The second line 152 consists of a double layer having a transparent conductive layer 152a and an opaque conductive layer 152b.

The data pad is connected to a tape carrier package (TCP) mounted with a first driving circuit for generating data voltages to thereby supply the data voltage to each anode voltage 104. The scan pad is provided at each side of the data pad. The scan pad is connected to a TCP mounted with a second driving circuit for generating scan voltages to thereby supply the scan voltage to each cathode electrode 112.

Further, the non-display area P2 is provided with a dummy barrier rib 109 connected to each of the barrier ribs positioned at the display area P1, and with a dummy insulating pattern 206 formed between the sealant 125 and the dummy barrier rib 109 in such a manner to have concave and convex portions.

The dummy barrier rib 109 is provided between the organic EL array and the sealant 125, thereby preventing the sealant 125 from being flown into the organic EL array along with the barrier rib 109 positioned at the display area P1.

The dummy insulating pattern 206 plays a role to partially expose the second line 152 through a concave area 206a and prevent the sealant 125 from being flown into the organic EL array.

In other words, even though a portion of the sealant 125 is moved toward the organic EL array when the substrate 102 is joined with the cap 128 for the purpose of packaging the organic EL array, the sealant 125 is dipped into the concave area 206a of the dummy insulating pattern 206 having a height of about 1 to 2 μm at the non-display area P2, thereby preventing the sealant 125 from being flown into the organic EL array.

This prevents the organic light-emitting layer of the organic EL array from damage by the sealant 125 during the encapsulation process, thereby preventing deterioration of light-emission efficiency and picture quality.

FIG. 10A to FIG. 10F are views for sequentially explaining a method of fabricating the organic EL display device according to the second embodiment of the present invention.

Figure 10A:
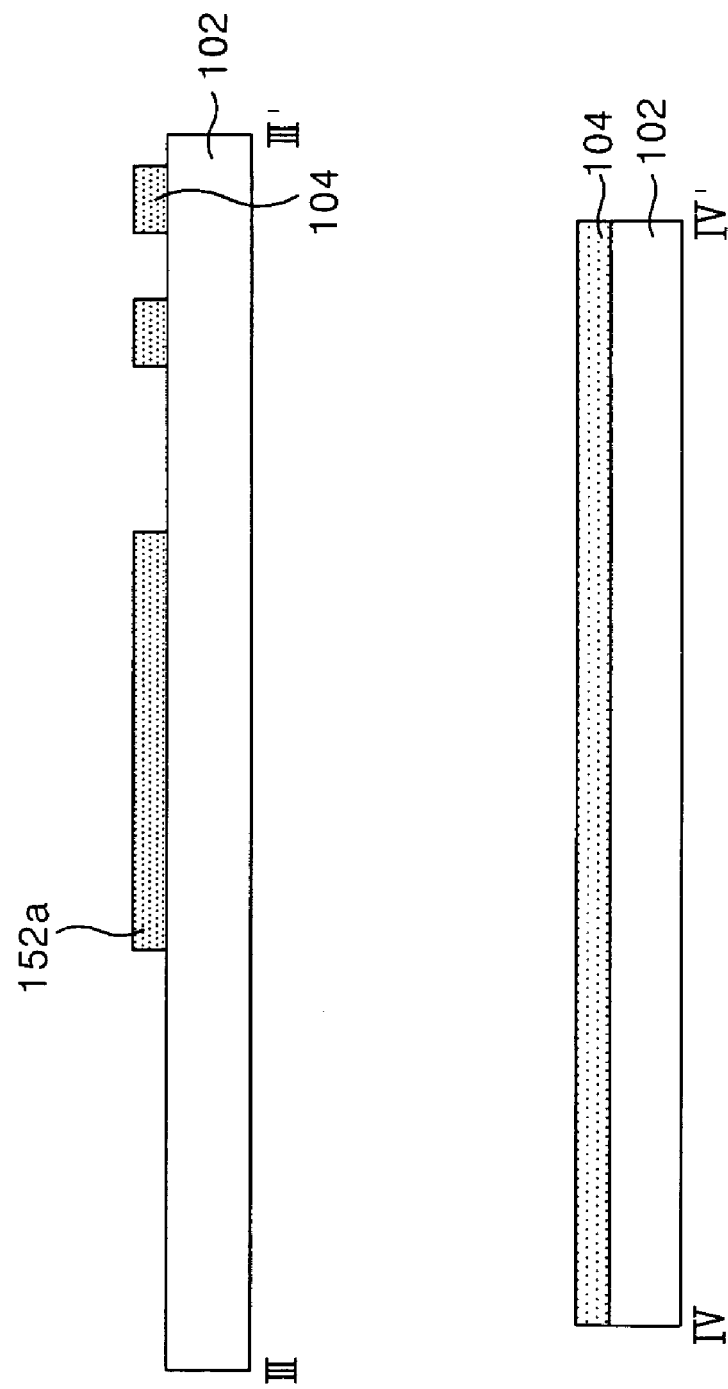

Firstly, as shown in FIG. 10A, the anode electrode 104 and the transparent conductive layer 152a are provided by depositing a metal transparent conductive material onto the substrate 102 made from a sodalime or a vulcanized glass and then patterning it by the photolithography and the etching process. Herein, indium-tin-oxide (ITO) or $SnO_2$ is used as the metal material.

As shown in FIG. 10B, the opaque conductive layer 152b is provided by forming an opaque conductive material on the substrate 102 provided with the anode electrode 104 and the transparent conductive layer 152a and patterning it by the photolithography and the etching process. Thus, there is provided the second line 152 that is a double layer of the transparent conductive layer 152a and the opaque conductive layer 152b.

Figure 10C:
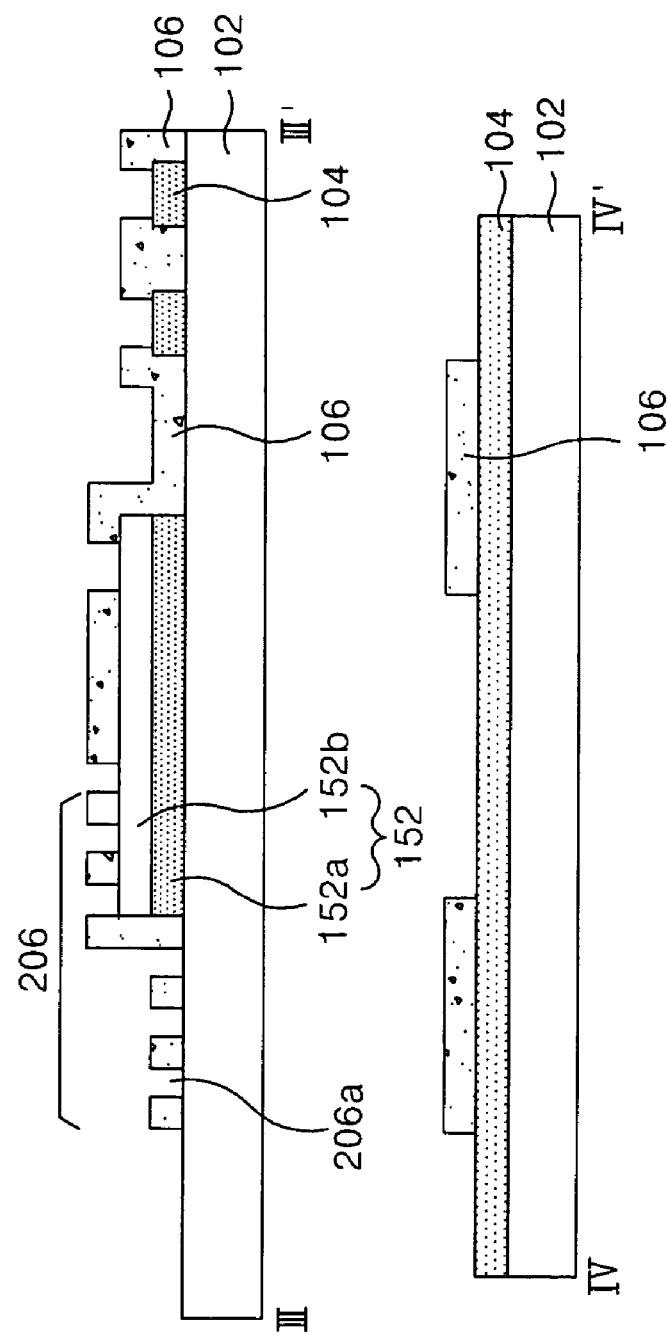
Figure 10D:
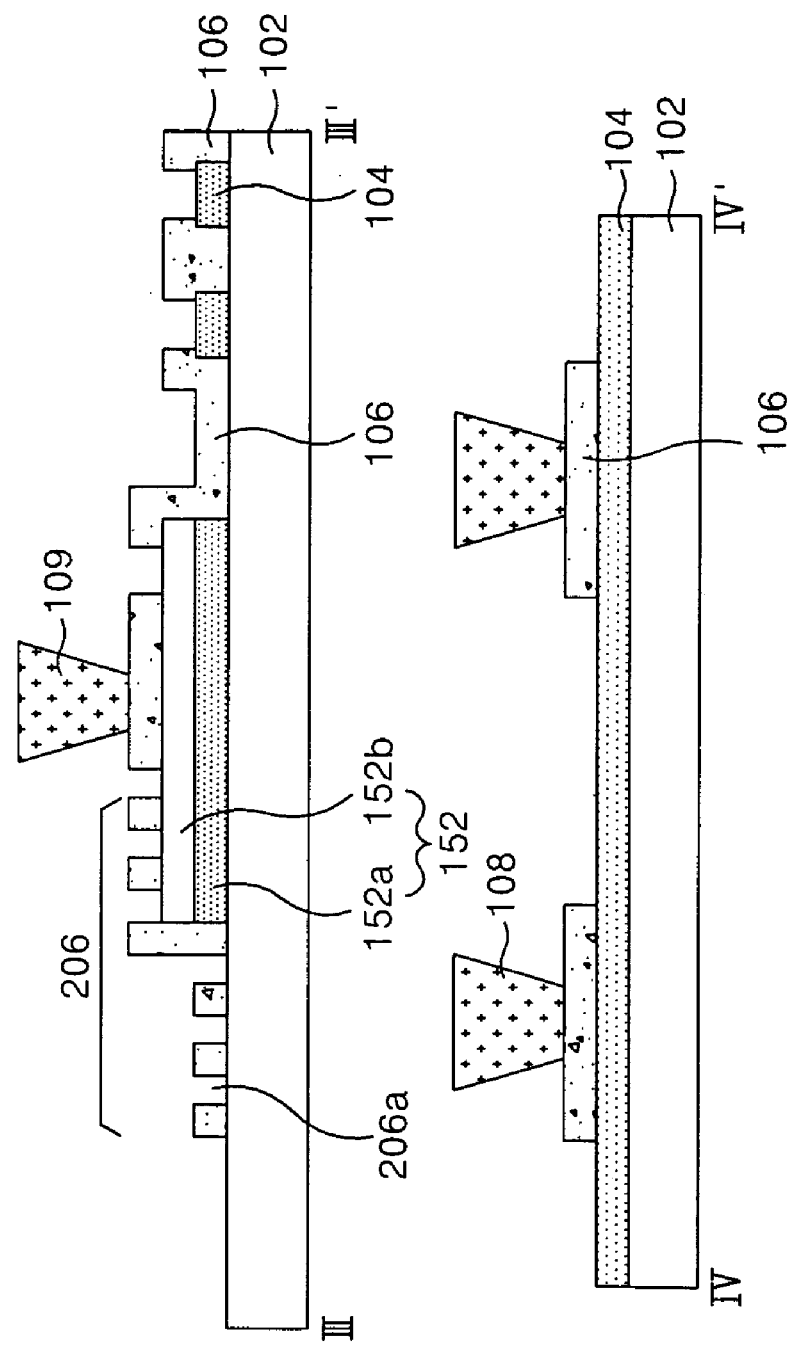

As shown in FIG. 10C, the insulating film 106 having the contact hole 175 exposing the light-emitting area of the display area P1 and exposing the second line 152 of the non-display area P2 is provided by coating a photosensitive insulating material onto the substrate 102 provided with the second line 152 by the spin coating technique and then patterning it by the photolithography and the etching process. Further, the dummy insulating pattern 206 positioned at the outer area of the insulating film 106 and having concave and convex portions is provided.

Figure 1:
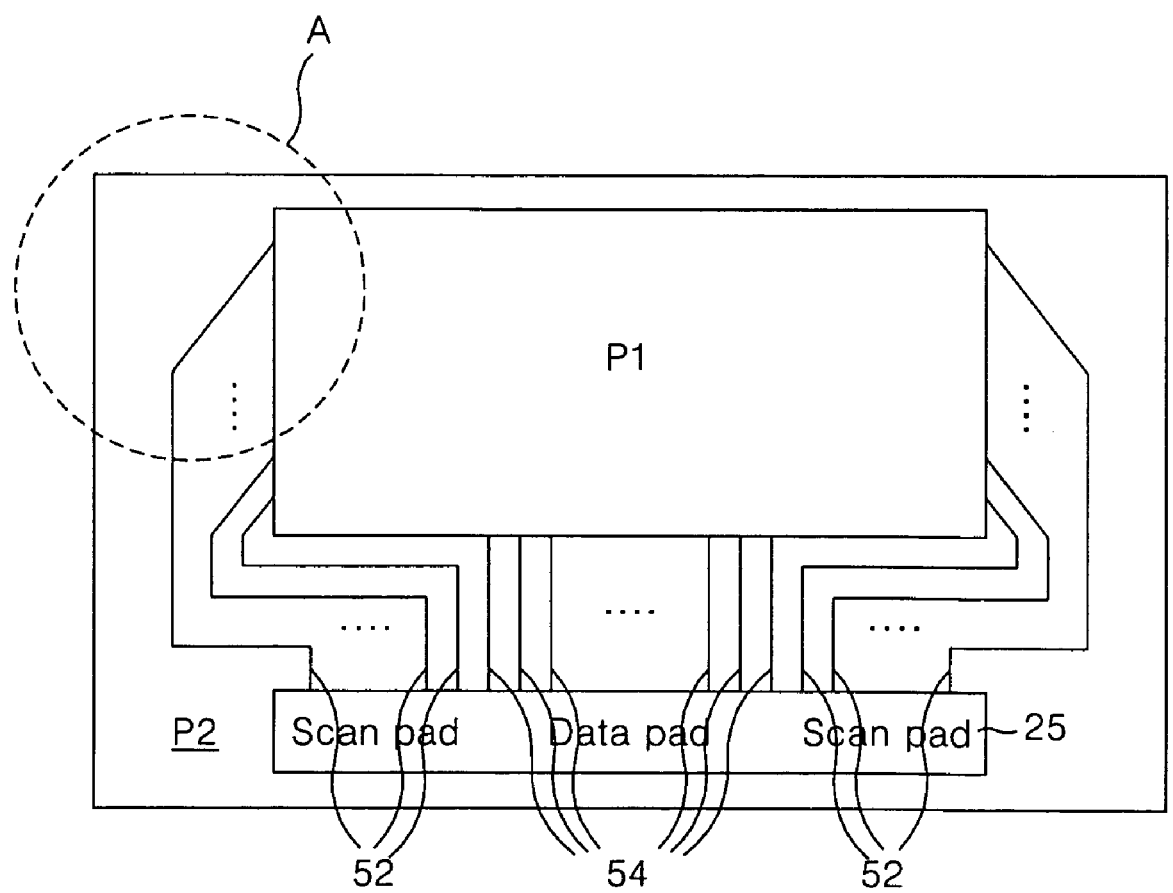
FIG. 1 is a schematic view showing a structure of a related art organic electro-luminescence display device.
Figure 2:
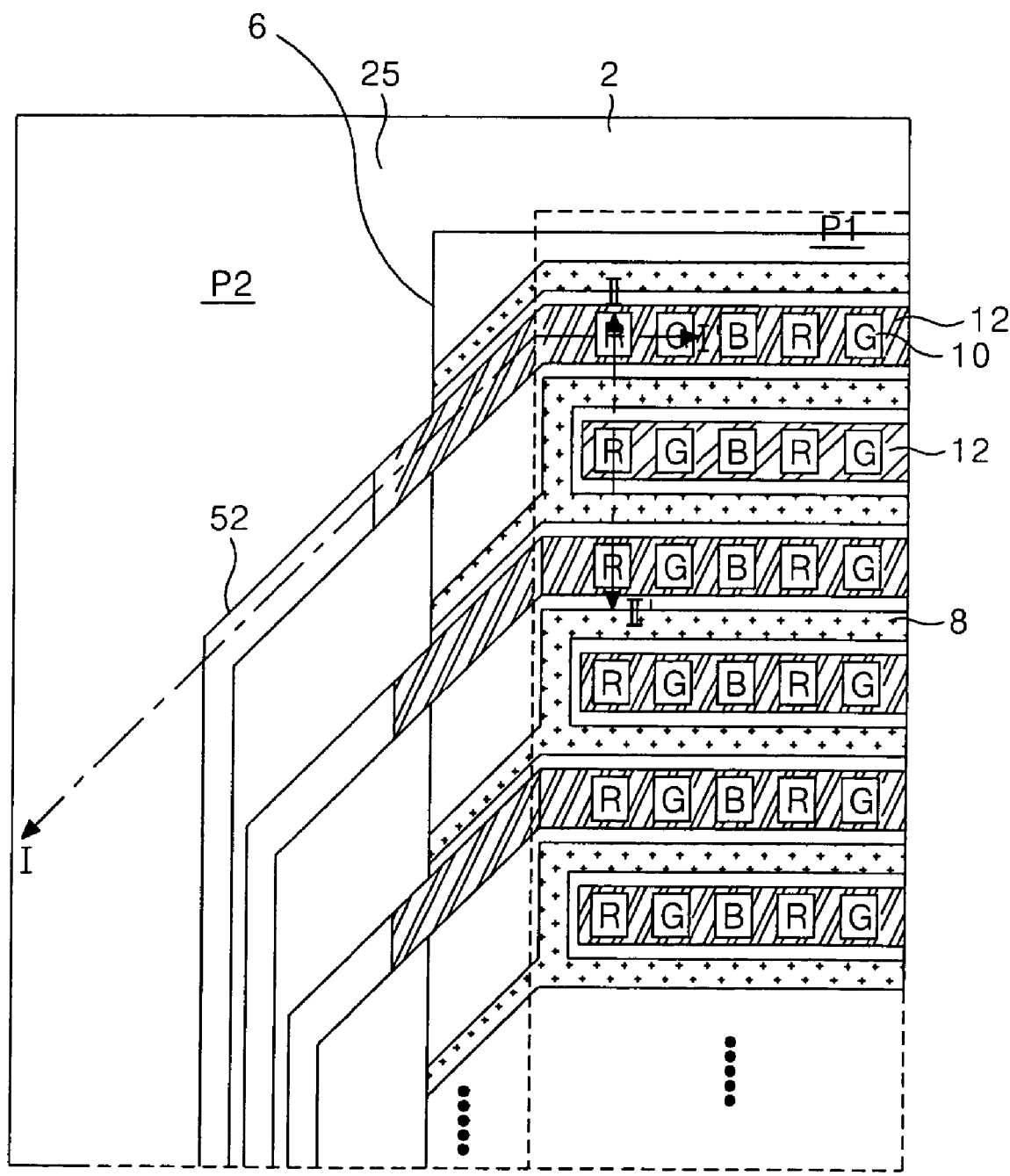
FIG. 2 is a detailed view of the A area of the organic electro-luminescence display device shown in FIG. 1.
Figure 3:
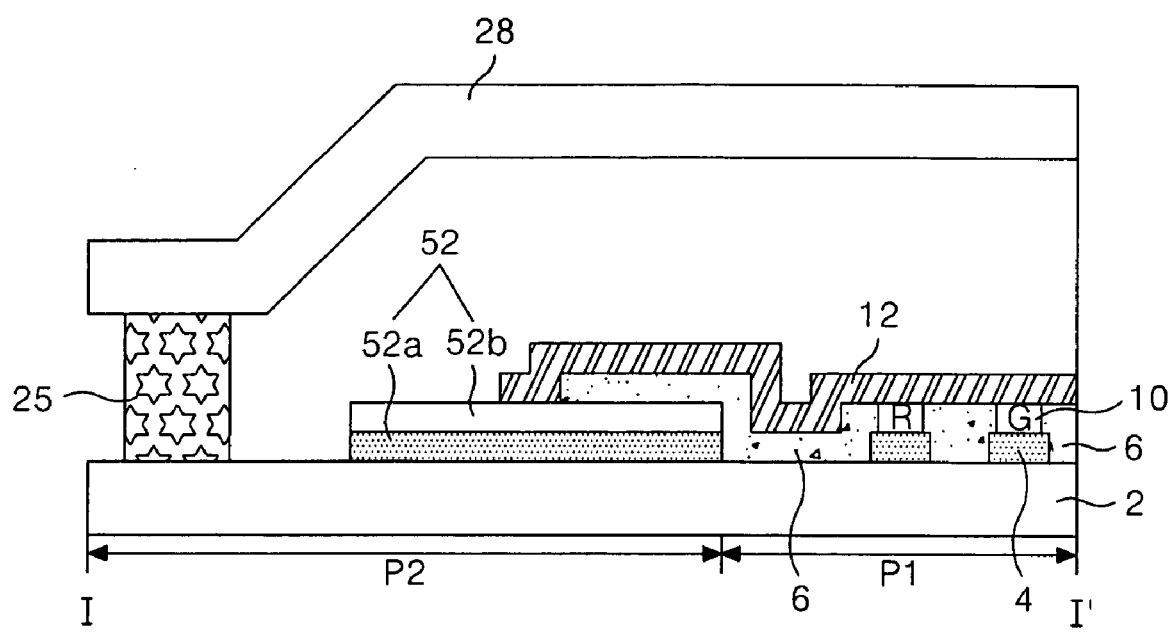
FIG. 3 is a section view of the portion of the organic El display device taken along the I-I' and II-II' lines in FIG. 2.
Figure 3:
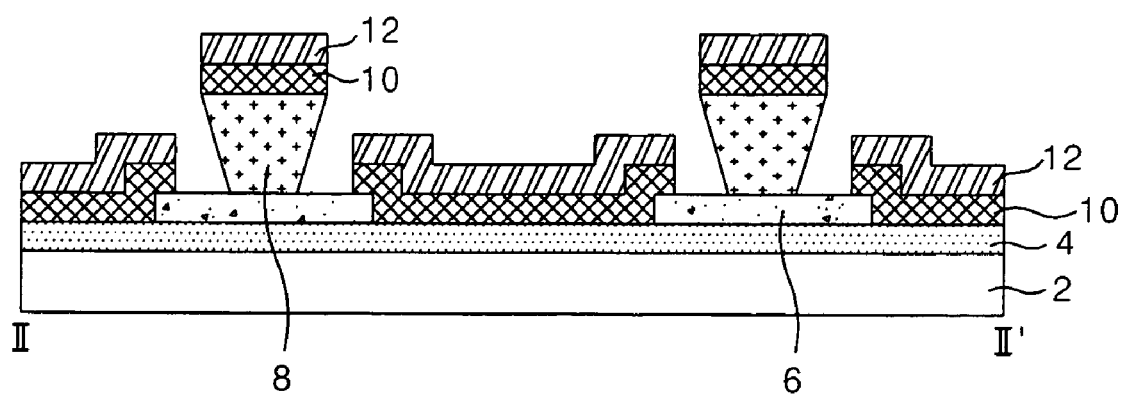
Figure 4:
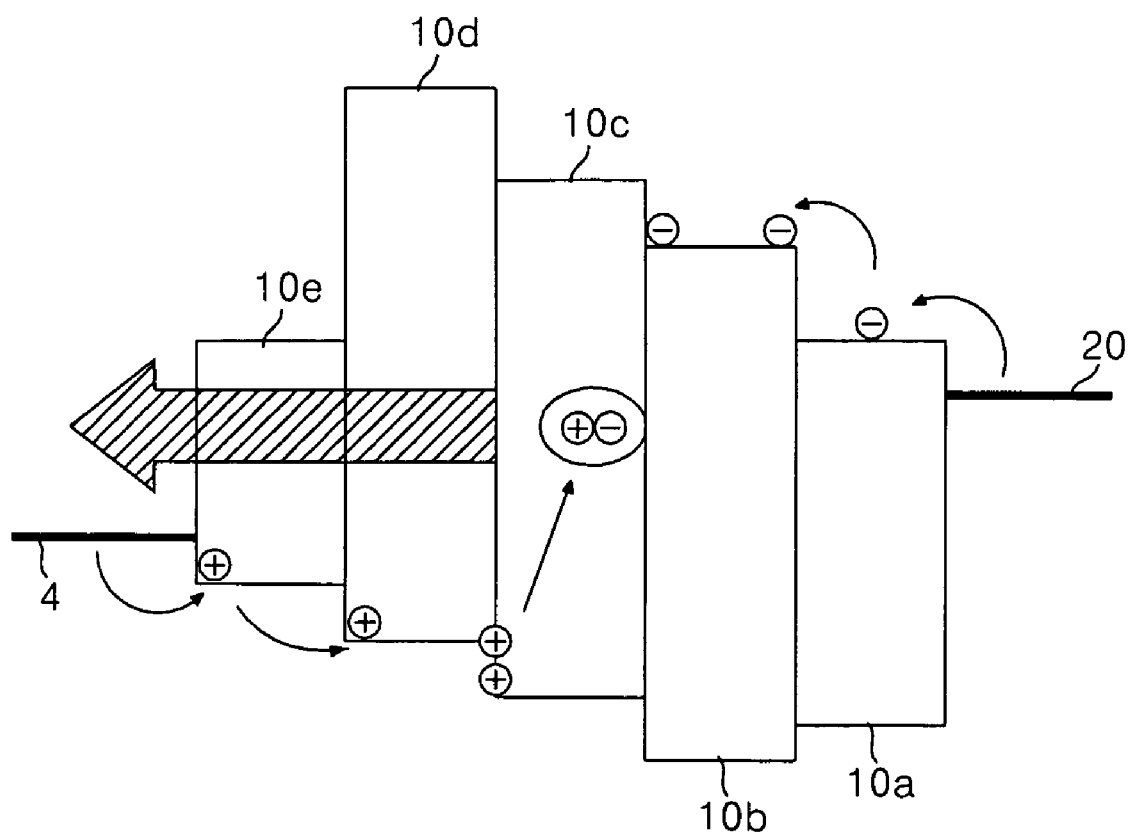
FIG. 4 is a diagram for explaining a light-emitting principle of the related art organic electro-luminescence display device.

As shown in FIG. 1D, the barrier rib 108 and the dummy barrier rib 109 are provided by depositing a photosensitive organic material onto the insulating film 106 by the photolithography and the etching process. The barrier rib 108 is provided at a non-emitting area in such a manner to cross a plurality of anode electrodes 104 in order to divide the pixels, and the dummy barrier rib 109 is connected to each of the barrier rib 108 at the display area P1 and is positioned at the non-display area P1. Herein, the barrier rib 108 and the dummy barrier rib 109 are provided in such a manner to connect each other, thereby enclosing the organic EL array.

Figure 10E:
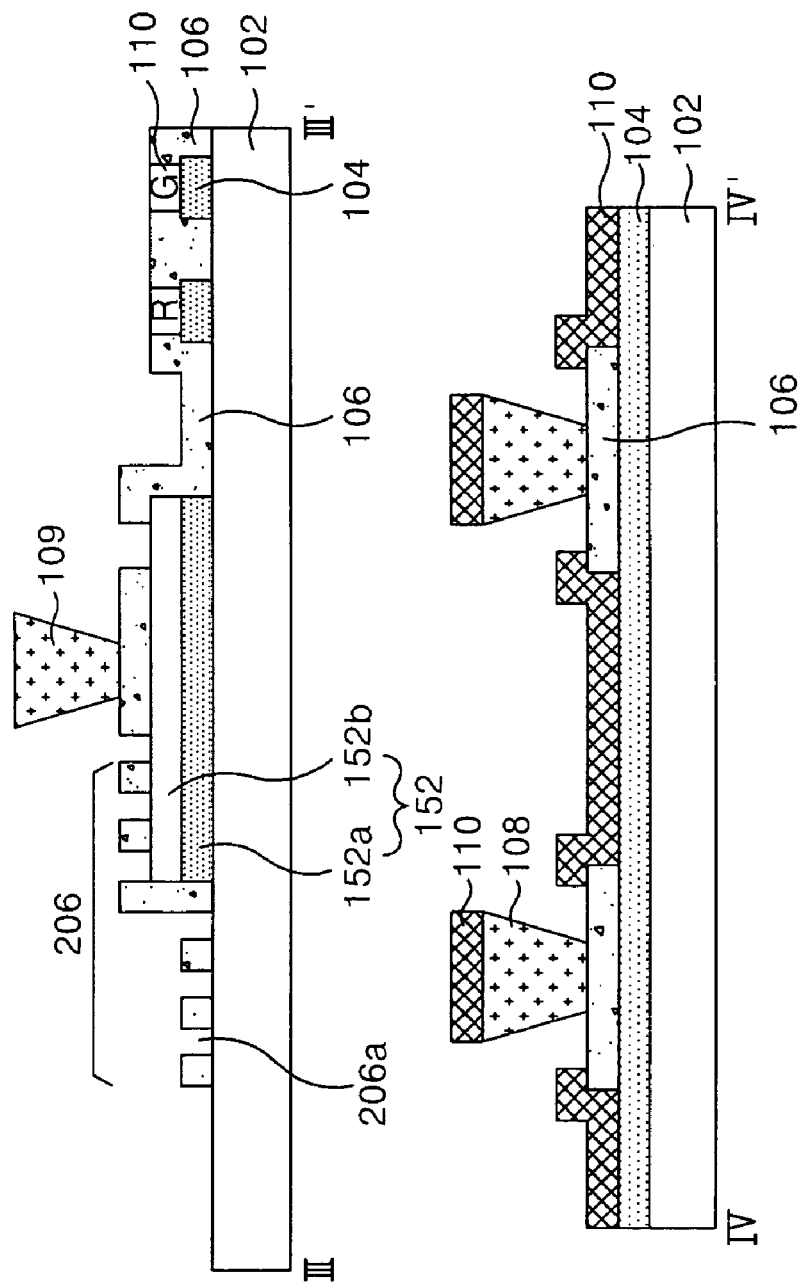

As shown in FIG. 10E, the organic light-emitting layer 110 is formed on the substrate 102 provided with the barrier rib 108.

As shown in FIG. 10F, the cathode electrode 112 formed in parallel to the barrier rib 108 and connected to the second line 152 exposed through the contact hole 175 is provided by depositing a metal material onto the substrate 102 provided with the organic light-emitting layer 110.

As described above, the organic EL display device according to the second embodiment of the present invention includes the dummy barrier rib 109 connected to each of the barrier ribs 108 at the display area P1 and located between the sealant 125 and the organic EL array. The dummy barrier rib 109 plays a role to prevent the sealant 125 from being flown into the organic EL array, along with the barrier rib 108 during the encapsulation process. Further, the dummy insulating pattern 206 having concave and convex portions is provided between the sealant 125 and the organic EL array, thereby dipping the sealant 125 flown into the organic EL array into the concave area 206a of the dummy insulating pattern 296. This prevents the sealant 125 from being flown into the organic EL array. Accordingly, the damage of the organic light-emitting layer 110 caused by the sealant 125 can be prevented and hence the deterioration of light-emission efficiency and picture quality can be prevented.

As described above, according to the present invention, the dummy barrier rib connected to each barrier rib and positioned at the non-display area is provided. Accordingly, a damage of the organic EL array caused by the sealant used when the cap is joined with the substrate can be prevented and hence a deterioration of light-emission efficiency and picture quality can be prevented.

Furthermore, according to the present invention, the insulating film having concave and convex portions is provided between the sealant and the dummy barrier rib at the display area. Accordingly, a damage of the organic EL array caused by the sealant used when the cap is joined with the substrate can be prevented and hence a deterioration of light-emission efficiency and picture quality can be prevented.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An organic electro-luminescence display device, comprising:
    an organic electro-luminescence array having first electrodes, second electrodes, organic light-emitting layers therebetween, and barrier ribs parallel to the first electrodes or the second electrodes; and
    a dummy barrier rib connected to an end of each of the barrier ribs, the dummy barrier rib and the barrier ribs surrounding the organic electro-luminescence array, wherein the dummy barrier rib is located between a sealant and the organic electro-luminescence array, the sealant surrounding the organic electro-luminescence array for sealing the organic electro-luminescence array.

2. The organic electro-luminescence display device according to claim 1, further comprising:
    a cap joined with the substrate by the sealant to seal the organic electro-luminescence array.

3. The organic electro-luminescence display device according to claim 1, wherein the sealant is positioned at the outer areas of the barrier rib and the dummy barrier rib.

4. The organic electro-luminescence display device according to claim 1, further comprising:
   a signal supply pad for supplying a driving signal to the organic electro-luminescence array; and
   a signal line for electrically connecting any one of the first and second electrodes to the signal supply pad.

5. The organic electro-luminescence display device according to claim 4, further comprising:
   an insulating film having a contact hole for exposing a light-emitting area at the first electrode and for exposing the signal line,
   wherein any one of the first and second electrodes is connected, via said contact hole, to the signal line.

6. An organic electro-luminescence display device in which a substrate provided with an organic electro-luminescence array is joined with a cap by a sealant in order to package the organic electro-luminescence array, said organic electro-luminescence display device comprising:
   a first insulating pattern positioned between the organic electro-luminescence array and the sealant and provided in such a manner to have concave and convex portions, wherein the first insulating pattern is spaced apart from cathodes and anodes of the organic electro-luminescence array.

7. The organic electro-luminescence display device according to claim 6, wherein the organic electro-luminescence array includes:
   organic light-emitting layers between the cathodes and the anodes; and
   barrier ribs parallel to any one of the cathodes and the anodes provided on the substrate.

8. The organic electro-luminescence display device according to claim 7, further comprising:
   a signal supply pad for supplying a driving signal to the organic electro-luminescence array; and
   a signal line for electrically connecting any one of the cathodes and the anodes to the signal supply pad.

9. The organic electro-luminescence display device according to claim 8, further comprising:
   a second insulating pattern having a contact hole for exposing a light-emitting area at the anode and for exposing a signal line,
   wherein any one of the cathodes and the anodes is connected, via said contact hole, to the signal line.

10. A method of fabricating an organic electro-luminescence display device in which a substrate provided with an organic electro-luminescence array is joined with a cap by a sealant in order to package the organic electro-luminescence array, said method comprising the step of:
    forming a first insulating pattern positioned between the organic electro-luminescence array and the sealant and provided in such a manner to have concave and convex portions, wherein the first insulating pattern is spaced apart from cathodes and anodes of the organic electro-luminescence array.

* * * * *